(12) United States Patent
North et al.

(10) Patent No.: US 10,985,086 B2
(45) Date of Patent: Apr. 20, 2021

(54) INFORMATION HANDLING SYSTEM LOW FORM FACTOR INTERFACE THERMAL MANAGEMENT

(71) Applicant: Dell Products L.P., Round Rock, TX (US)

(72) Inventors: Travis C. North, Cedar Park, TX (US); Deeder M. Aurongzeb, Austin, TX (US); Claire Hao Wen Hsu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 14 days.

(21) Appl. No.: 16/504,484

(22) Filed: Jul. 8, 2019

(65) Prior Publication Data
US 2021/0013125 A1     Jan. 14, 2021

(51) Int. Cl.
*H01L 23/427*    (2006.01)
*H01L 23/00*     (2006.01)
*G06F 1/20*      (2006.01)

(52) U.S. Cl.
CPC ............ *H01L 23/427* (2013.01); *G06F 1/203* (2013.01); *H01L 24/27* (2013.01); *H01L 24/29* (2013.01); *H01L 24/32* (2013.01); *H01L 24/83* (2013.01); *G06F 2200/201* (2013.01); *H01L 2224/27452* (2013.01); *H01L 2224/29124* (2013.01); *H01L 2224/29286* (2013.01); *H01L 2224/29318* (2013.01); *H01L 2224/29339* (2013.01); *H01L 2224/32245* (2013.01); *H01L 2224/83192* (2013.01); *H01L 2924/1432* (2013.01)

(58) Field of Classification Search
CPC ....... H01L 23/427; H01L 24/27; H01L 24/29; H01L 24/32; H01L 24/83; H01L 2224/27452; H01L 2224/29124; H01L 2224/29286; H01L 2224/29318; H01L 2224/29339; H01L 2224/32245; H01L 2224/83192; H01L 2924/1432; G06F 1/203; G06F 2200/201
See application file for complete search history.

(56) References Cited

U.S. PATENT DOCUMENTS

| | | | |
|---|---|---|---|
| 2014/0209168 A1* | 7/2014 | Zhamu | H01L 31/052 136/259 |
| 2015/0237767 A1* | 8/2015 | Shedd | H05K 7/20772 165/104.31 |
| 2015/0362265 A1 | 12/2015 | Broido et al. | |

(Continued)

FOREIGN PATENT DOCUMENTS

WO    WO2019152782 A1    8/2019

*Primary Examiner* — Fernando L Toledo
*Assistant Examiner* — Neil R Prasad
(74) *Attorney, Agent, or Firm* — Zagorin Cave LLP; Robert W. Holland

(57) ABSTRACT

Information handling system thermal rejection of thermal energy generated by one or more components, such as a central processing unit and graphics processing unit, is enhanced by disposing boron arsenide between the one or more components and a heat transfer structure that directs thermal energy from the one or more components to a heat rejection region, such as cooling fan exhaust. For instance, the boron arsenide is a layer formed with chemical vapor deposition on a copper heat pipe or a layer of thermal grease infused with the boron arsenide.

18 Claims, 3 Drawing Sheets

(56) References Cited

U.S. PATENT DOCUMENTS

2017/0133295 A1    5/2017  Gu et al.
2019/0014689 A1*  1/2019  Yu .......................... H01L 23/427
2019/0190232 A1*  6/2019  Tayebati ................. C23C 16/27

* cited by examiner

INFORMATION HANDLING SYSTEM LOW FORM FACTOR INTERFACE THERMAL MANAGEMENT

BACKGROUND OF THE INVENTION

Field of the Invention

The present invention relates in general to the field of information handling system thermal management, and more particularly to an information handling system low form factor interface thermal management.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Generally, information handling systems process information by executing instructions on a processor. Typically, the processor interfaces with random access memory (RAM), which stores the information and instructions. A variety of other components provide power, communication, graphics and other functions to support the information processing with the components cooperating through wirelines of a printed circuit board generally referred to as a motherboard. For instance, a motherboard typically includes a socket that accepts the processor, memory, and a graphics processor, such as a ball grid array (BGA) socket, and contact pads to support surface mount technology components, such as a memory, power supply, communications hub, networking device and analog components. The motherboard couples to a housing of the information handling system to physically support the components. Generally, components on the motherboard operate by consuming current that dissipates to generate thermal energy.

Information handling system housings include server and desktop housings, generally designed to rest in one location and operate with an external power source, and portable housings, designed to support mobile use with an integrated battery power source. Generally, information handling systems include thermal management devices that aid in dissipation of thermal energy from within the interior of the housing to the exterior of the housing. Server and desktop information handling systems tend to rely on active thermal management in which cooling fans generate a cooling airflow through the housing. Portable information handling systems often also include active thermal management with cooling fans, however, the smaller housing volumes associated with portable information handling systems tend to restrict the size of cooling fans that can fit in the portable housing. In some instances, portable information handling system rely only on passive thermal cooling, such as where housing size is too restrictive to include a cooling fan.

Passive thermal cooling generally involves transfer of thermal energy through physical structures, such as heat pipes. For example, a copper heat pipe is thermally-coupled to a central processing unit (CPU) and then routed to a housing surface where the thermal energy is rejected to the external environment. In some instances, a thermal sink couples to the heat pipe and/or CPU to provide extra mass for thermal absorption and increased surface area for thermal release. Heat pipe and heat sink structures are also often included in systems that rely on active cooling, such as by routing a heat pipe towards a cooling fan exhaust and extending a heat sink up from the heat pipe into the exhaust airflow.

One difficulty with transfer of thermal energy to a passive thermal transfer structure, such as a heat pipe, is that the component that creates the thermal energy typically has different thermal transfer properties than the material used in the thermal transfer structure, typically copper. Thermal resistance at an interface between a component and thermal transfer device reduces the efficiency with which thermal energy transfers to the heat pipe. In some instances, a thermal interface material is disposed between the component and the heat pipe, such as silver or aluminum. However, in order to achieve sufficient stress resistance and thermal distribution, the thermal interface material tends to have a minimum thickness that adds to the overall height of the component and, hence, the information handling system. Since the thermal interface material typically has less thermal conductivity than the heat pipe material, thermal diffusion becomes a problem that interferes with transfer of thermal energy to the heat pipe.

SUMMARY OF THE INVENTION

Therefore, a need has arisen for a system and method which provides an information handling system low form factor interface thermal management.

In accordance with the present invention, a system and method are provided which substantially reduce the disadvantages and problems associated with previous methods and systems for managing thermal energy transfer from an information handling system component in a low form factor structure. Boron arsenide is disposed between a component that generates thermal energy and a thermal transfer structure, such as a heat pipe or a heat sink, to aid in thermal transfer from the component to the thermal transfer structure. In one embodiment, boron arsenide promotes thermal transfer between an integrated circuit die and the integrate circuit's package integrated heat transfer spreader.

More specifically, an information handling system processes information with components disposed on a motherboard that generate heat as power dissipates through the components due to consumption of current. A heat transfer structure thermally couples to one or more of the components to absorb thermal energy from the one or more of the components and transfer the thermal energy to a thermal rejection region, such as a cooling fan exhaust. A thermal interface material that includes boron arsenide is disposed between the component and the heat transfer structure to aid in transfer of thermal energy. In one example embodiment, a boron arsenide layer is formed on the heat transfer structure and/or the component with a chemical vapor deposition. In another example embodiment, boron arsenide is included in a thermal grease that is applied between the heat transfer structure and the component. In yet another example embodiment, the component is a central processing unit integrated circuit that includes a silicon die held in a package having an integrated heat spreader and having a boron arsenide disposed between the die and integrated heat spreader.

The present invention provides a number of important technical advantages. One example of an important technical advantage is that an information handling system component thermally couples to a heat transfer material with a boron arsenide thermal transfer material layer. Boron arsenide has a higher thermal conductivity than silver and aluminum materials to improve thermal transfer across a thermal interface and reduce thermal diffusion. For instance, in one example embodiment an interface of boron arsenide provides 15 W/mk of thermal conductivity compared with 5.7 W/mk for silver and 4.7 W/mk for aluminum. The improved thermal conductivity provided by a boron arsenide material layer supports reduced thickness at the thermal interface for a lower form factor structure to help reduce information handling system height.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system component transfers thermal energy to a heat transfer structure through a boron arsenide thermal interface material. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
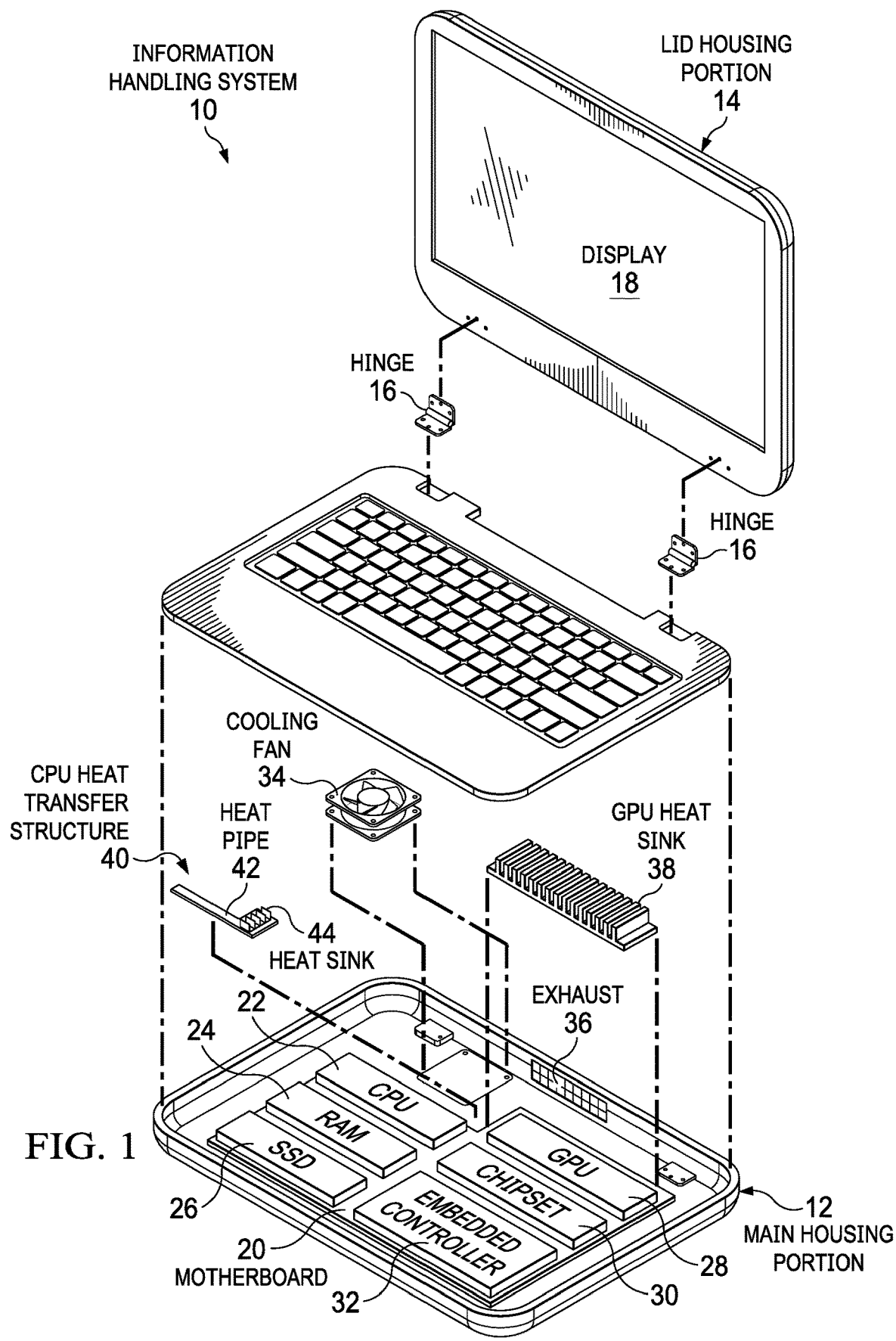
FIG. 1 depicts an exploded view of an information handling system having a heat transfer structure that transfers thermal energy from a component through a thermal interface material.

Referring now to FIG. 1, an exploded view depicts an information handling system 10 having a heat transfer structure 40 that transfers thermal energy from a component 22 through a thermal interface material. In the example embodiment, information handling system 10 has a portable configuration with a main housing portion 12 coupled to a lid housing portion 14 by a hinge 16 to rotate between open and closed positions. In alternative embodiments, the thermal interface material described herein may be used in other configurations, such as desktop and server information handling system configurations. In the example portable configuration, lid housing portion 14 integrates a display 18 that presents information as visual images and main housing portion 12 integrates processing components that cooperate to process information. For instance, a motherboard 20 couples to main housing portion 12 and includes wirelines that support communication between a central processing unit (CPU) 22 that executes instructions to process information and a random access memory (RAM) 24 that stores the instructions and information. A solid state drive (SSD) 26 provides persistent storage of information during power down of the system. An embedded controller 32 manages interactions with input devices and also manages system power, such as by applying power to CPU 22 on startup. Embedded code executing on embedded controller 32 initiates a bootstrap at power on of CPU 22 to recall an operating system from SSD 26 to RAM 24 for execution on CPU 22. A chipset 30 coordinates operation of CPU 22, such as by managing CPU 22 clock speed and memory accesses. A graphics processing unit (GPU) 28 receives visual information from CPU 22 and defines an array of pixels that define a visual image on display 18. The processing components are provided as one example of an information handling system configuration and, in alternative embodiments, a variety of other processing component configurations may be used.

During operation of the processing components, direct current power is applied to the processing components resulting in dissipation of energy to a thermal form. In order to manage thermal energy generated by the powering of the processing components, a cooling fan 34 runs to create a cooling airflow that exits main housing portion 12 at an exhaust 36. For instance, embedded controller 32 executes thermal management embedded code to cooperate with cooling fan 34 so that defined thermal conditions are met. If excessive thermal conditions exist and cooling fan 34 is running at full speed, embedded controller 32 will throttle the processing components to reduce generation of thermal energy, such as by slowing the clock speed of CPU 22. High cooling fan 34 speeds and reduced processing speeds tend to impact the end user experience in a negative manner. Thus, a heat transfer structure 40 is included in information handling system 10 to aid in transfer of thermal energy away from the processing components for rejection by cooling fan 34 out of exhaust 36. In one example embodiment, thermal conditions are measured based in part on component temperatures, such as with thermal sensors included in integrated circuits; however ambient temperatures within main housing portion 12 may also be used.

In the example embodiment, heat transfer structure 44 includes a heat pipe 42 integrated with a heat sink 44 to couple to CPU 22. A separate heat transfer structure to couple on GPU 28 is only a heat sink 38. In alternative embodiments, a heat transfer structure 40 may be a heat pipe 42 used without a heat sink, such as where vertical height is limited within main housing portion 12, or other similar structures. In each case, heat transfer structure 40 provides a thermally-conductive material, typically copper, that has minimal thermal resistance to help draw thermal energy away from the component and to a thermal rejection region, such as exhaust 36. Heat pipe 42 has a length of thermally-conductive material, such as copper, that draws heat away from the component to a distal region. Heat sinks 38 and 44 provide a mass that "stores" thermal energy and includes a larger surface area for release of the thermal energy to external air. In various embodiments, heat transfer structures may be built from copper, silver, aluminum, graphene and other thermally-conductive materials.

Figure 2:
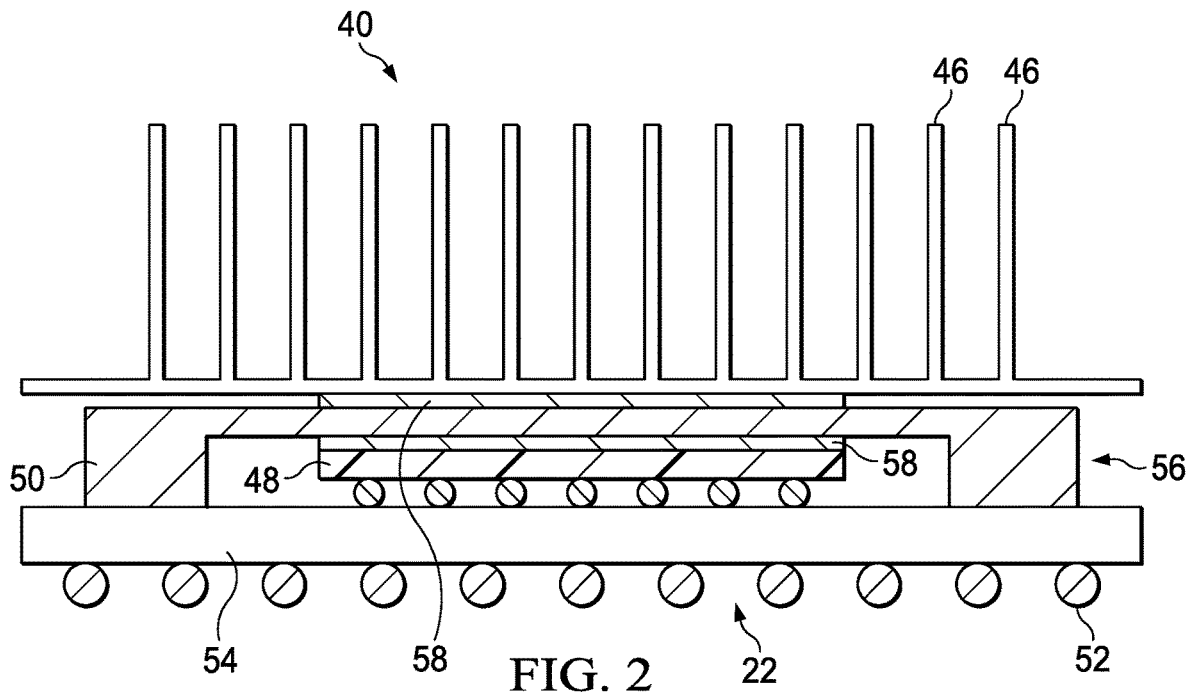
FIG. 2 depicts a side cutaway view of a CPU that transfers thermal energy to a heat sink through a thermal interface material.

Referring now to FIG. 2, a side cutaway view depicts a CPU 22 that transfers thermal energy to a heat sink 40 through a thermal interface material 58. CPU 22 is an integrated circuit package 50 having a silicon integrated circuit die 48 that uses direct current power to execute instructions. The integrated circuit die 48 communicates with a motherboard through an array of ball grid array (BGA) connectors 52 that interface with the integrated circuit die 48 through a substrate 54. A package integrated heat spreader 56 couples to substrate 54 and to integrated circuit die 48 to draw thermal energy for integrated circuit die 48. Coupled to the upper side of integrated circuit package 50 is a heat sink 40 having plural fins 46 that provide an increased surface area for release of thermal energy to the external environment. Integrated circuit die 48 integrates a temperature sensor that aids in management of thermal energy at integrated circuit CPU 22. Package integrated heat spreader 56 helps to maintain die temperature constraints by removing thermal energy from the die. Similarly heat sink 40 removes thermal energy from package integrated heat spreader 56 to reduce its temperature for more efficient thermal transfer from integrated circuit die 48. In various operating conditions, thermal energy release by integrated circuit die 48 may vary considerably as power dissipation changes.

In order to enhance thermal transfer between different materials of integrated circuit die 48, package integrated heat spreader 56 and heat sink 40, a thermal interface material 58 is used. Specifically, thermal interface material 58 includes boron arsenide to enhance thermal energy transfer. Conventional thermal interface materials are typically formulated as a "thermal grease" filler that includes silver, zinc and/or aluminum. Boron arsenide as a thermal interface material 58 may replace conventional thermal interface materials or be used in combination with conventional thermal interface materials, such as by inclusion in a thermal grease. Boron arsenide provides a thermal conductivity of 1300 W/mk as a material, 15 W/mk when used as a thermal interface material, and a thermal resistance of 0.02 W/mk in an example embodiment having a die of 30 mm×30 mm with a thickness of 0.3 mm. By comparison on a similar size die, silver has a thermal conductivity as a material of 406 W/mk, a thermal conductivity at a thermal interface material of 5.7 W/mk and a thermal resistance of 0.06 W/mk; and aluminum has a thermal conductivity as a material of 235 W/mk, a thermal conductivity at a thermal interface material of 4.7 W/mk and a thermal resistance of 0.07 W/mk. The improved thermal properties of boron arsenide allows thermal interface material 58 to have 30-50% of the volume of a conventional thermal interface material with similar thermal transfer characteristics. As a result, the height of the integrated circuit and heat transfer structure is reduced.

Figure 3:
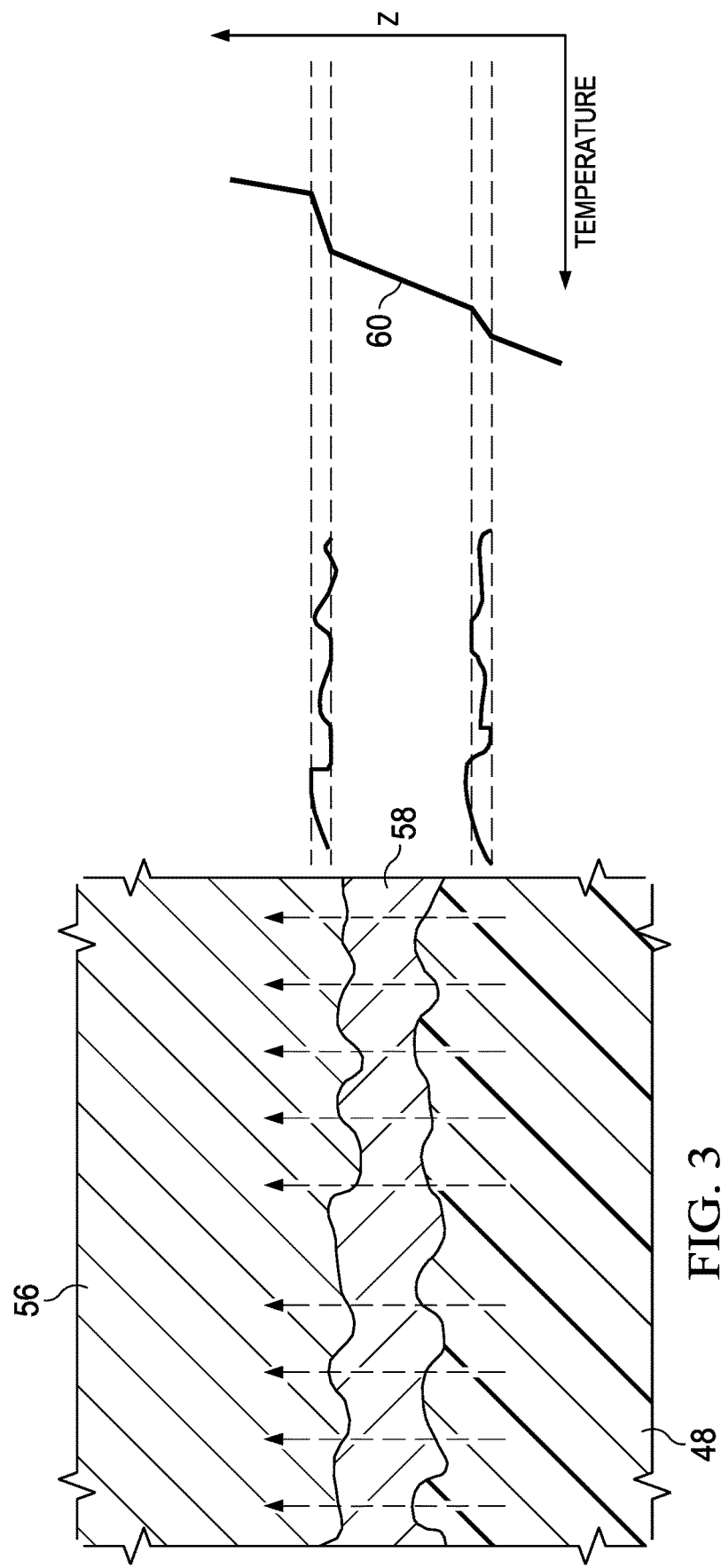
FIG. 3 depicts a close-up cutaway view of a thermal interface material and the relationship of the thermal interface to thermal energy transfer.

Referring now to FIG. 3, a close-up cutaway view depicts a thermal interface material 58 and the relationship of the thermal interface to thermal energy transfer. A thermal gradient 60 is created at each side of thermal interface material 58 where it couples to integrated circuit die 48 and integrated heat spreader 56. Thermal gradient 60 illustrates that a larger temperature difference is present across the material interface than within either material itself. The improved thermal characteristics of boron arsenide reduces thermal gradient 60 by improving transfer of thermal energy horizontally within thermal interface material 58 and vertically between the adjacent physical layers.

In one example embodiment, boron arsenide is deposited as a layer on at least one adjacent surface, such as on the heat transfer structure 40 or on integrated circuit die 48. For instance, chemical vapor deposition is used to deposit a layer of boron arsenide on both the integrated circuit package and the heat transfer structure. For a copper heat pipe and/or heat sink, an acid etch may be performed before chemical vapor deposition and the area associated with thermal transfer across the thermal interface material 58 may be masked so that chemical vapor deposition is performed over the relevant area rather than across the entire surface of the heat transfer structure. Other techniques may be used to prepare the appropriate surface to accept the boron arsenide depending upon the material involved. For instance, integrated circuit die 48 may be capped with lid or other nonconductive material that is the treated with chemical vapor deposition. One or both sides thermal interface material 58 may have a chemical vapor deposition layer of boron arsenide with thermal grease placed within the thermal interface material. The thermal grease may or may not include boron arsenide infused in it. Although FIG. 3 depicts a thermal interface material between integrated circuit die 48 and integrated heat spreader 56, similar approaches may be applied to the thermal interface material disposed between heat transfer structure 40 and integrated heat spreader 56. In one embodiment, chemical vapor deposition is applied to both the upper surface of integrated heat spreader 56 and the lower surface of a heat pipe or heat sink so that adjacent surface layers of boron arsenide are assembled to each other and, where possible, established as a contiguous material layer.

Figure 4:
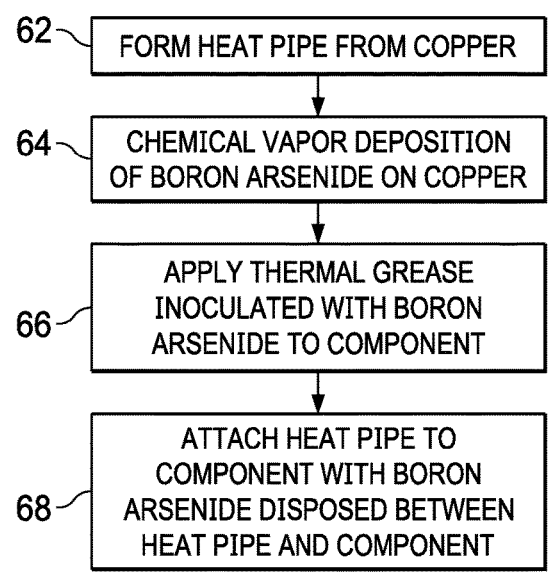
FIG. 4 depicts a flow diagram of a process for assembly of an information handling system to include a boron arsenide thermal interface material.

Referring now to FIG. 4, a flow diagram depicts a process for assembly of an information handling system to include a boron arsenide thermal interface material. The process starts at step 62 by form a heat pipe with copper. In alternative embodiments, other types of heat transfer structures may be used with other types of thermally conductive materials, such as a heat sink and aluminum. At step 64, chemical vapor deposition applies a layer of boron arsenide to the heat pipe. In one embodiment, the copper surface may be roughed in preparation of the chemical vapor deposition, such as with an acid etch or mechanical treatment. The chemical vapor deposition may be performed within a masked area to limit the boron arsenide to relevant parts of the copper structure. At step 66, a thermal grease or other filler material inoculated with boron arsenide is applied at the thermal intersection of the heat pipe and integrated circuit. In various embodiments, boron arsenide may be applied with only one of the chemical vapor deposition layer or the thermal grease layer, as described above. Further, the thermal grease or other filler material may include only boron arsenide or a combination of boron arsenide with various other types of thermal interface materials, such as silver, zinc and aluminum. At step 68, the heat pipe is attached to the integrated circuit with the boron arsenide disposed between the heat pipe and integrated circuit.

Although the present invention has been described in detail, it should be understood that various changes, substitutions and alterations can be made hereto without departing from the spirit and scope of the invention as defined by the appended claims.

What is claimed is:

1. An information handling system comprising:
   a component coupled to a motherboard and interfaced with a power source to cooperate in processing information, the component generating thermal energy in response to application of power from the power source;
   a heat pipe proximate the component and extending to a thermal rejection region, the heat pipe configured to transfer the thermal energy from the component to the thermal rejection region; and
   a thermal interface material disposed between the component and the heat pipe, the thermal interface material including at least boron arsenide;
   wherein the component comprises a central processing unit having a die disposed in a package and the boron arsenide is disposed between the die and the package.

2. The information handling system of claim 1 wherein the boron arsenide comprises a layer deposited on the heat pipe and aligned with the component.

3. The information handling system of claim 2 wherein the boron arsenide comprises a filler material attached to the component.

4. The information handling system of claim 3 wherein the filler material comprises silver.

5. The information handling system of claim 3 wherein the filler material comprises zinc.

6. The information handling system of claim 2 wherein the heat pipe comprises copper and the boron arsenide is deposited on the copper with chemical vapor deposition.

7. The information handling system of claim 1 wherein the boron arsenide is further disposed on a side of the package external to the die.

8. The information handling system of claim 1 wherein the component comprises a graphics processing unit.

9. A method for transferring thermal energy from an information handling system component, the method comprising:
   coupling the component to a motherboard;
   coupling a heat transfer structure to the component; and
   disposing boron arsenide between the component and the heat transfer structure;
   wherein:
   the component comprises a processor having a die contained in a package;
   the heat transfer structure comprises the package; and
   the disposing boron arsenide further comprises disposing the boron arsenide between the package and the die.

10. The method of claim 9 wherein:
    the heat transfer structure comprises a copper heat pipe; and
    the disposing boron arsenide further comprises chemical vapor deposition of the boron arsenide on the copper heat sink.

11. The method of claim 9 wherein:
    the component comprises a graphics processing unit; and
    the disposing boron arsenide further comprises including the boron arsenide in a filler material disposed between the graphics processing unit and the heat transfer structure.

12. The method of claim 11 wherein:
    the heat transfer structure comprises a heat sink; and
    the filler material comprises zinc thermal grease.

13. The method of claim 9 further comprising:
    the component comprises a central processing unit; and
    the disposing boron arsenide further comprises including the boron arsenide in thermal grease applied between the central processing unit and the heat transfer structure.

14. The method of claim 13 wherein the thermal grease comprises aluminum.

15. The method of claim 13 wherein the heat transfer structure comprises a heat sink.

16. An information handling system thermal management device comprising:
    a heat pipe having a first end configured to couple to a processor and a second end extending to a thermal energy rejection region; and
    a boron arsenide layer coupled to the heat pipe at the first end and aligned to dispose between the heat pipe and processor; and
    a processor coupled to the heat pipe at the boron arsenide layer, the processor having a package, the package having a heat spreader and a die, a layer of boron arsenide disposed between the heat spreader and the die.

17. The information handling system thermal management device of claim 16 wherein the boron arsenide layer comprises a layer deposited on the heat pipe with chemical vapor deposition.

18. The information handling system thermal management device of claim 16 wherein the boron arsenide layer comprises a thermal grease infused with boron arsenide.

* * * * *